(12) United States Patent
Yoon

(10) Patent No.: US 8,953,391 B1
(45) Date of Patent: Feb. 10, 2015

(54) SEMICONDUCTOR APPARATUS

(71) Applicant: SK Hynix Inc., Icheon-si Gyeonggi-do (KR)

(72) Inventor: Young Jun Yoon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/076,340

(22) Filed: Nov. 11, 2013

(30) Foreign Application Priority Data

Aug. 1, 2013 (KR) ........................ 10-2013-0091524

(51) Int. Cl.
*G11C 7/10* (2006.01)
*G11C 29/00* (2006.01)
*G11C 8/00* (2006.01)
*G11C 29/04* (2006.01)

(52) U.S. Cl.
CPC ..................................... *G11C 29/04* (2013.01)
USPC ................. 365/189.05; 365/189.17; 365/201; 365/233.1

(58) Field of Classification Search
USPC ...................... 365/189.05, 189.17, 201, 233.1
See application file for complete search history.

(56) References Cited

U.S. PATENT DOCUMENTS

| | | | | |
|---|---|---|---|---|
| 5,511,029 | A * | 4/1996 | Sawada et al. | 365/189.05 |
| 6,496,429 | B2 * | 12/2002 | Murai et al. | 365/201 |
| 6,512,707 | B2 * | 1/2003 | Miura et al. | 365/189.05 |
| 6,606,274 | B2 * | 8/2003 | Ooishi et al. | 365/201 |
| 8,107,314 | B2 * | 1/2012 | Hara | 365/189.05 |
| 8,274,847 | B2 * | 9/2012 | Yoko | 365/189.05 |
| 8,400,805 | B2 * | 3/2013 | Yoko | 365/189.05 |
| 8,547,775 | B2 * | 10/2013 | Yoko | 365/189.05 |
| 8,687,449 | B2 * | 4/2014 | Yoko | 365/189.05 |
| 8,717,839 | B2 * | 5/2014 | Yokou et al. | 365/201 |

FOREIGN PATENT DOCUMENTS

| | | |
|---|---|---|
| KR | 100892633 B1 | 4/2009 |
| KR | 100915822 B1 | 8/2009 |

* cited by examiner

*Primary Examiner* — Trong Phan
(74) *Attorney, Agent, or Firm* — William Park & Associates Patent Ltd.

(57) ABSTRACT

A semiconductor apparatus includes an input buffer configured to buffer and output data inputted from a data input/output pad; a data input control unit configured to transfer data outputted from the input buffer; a data output control unit configured to transfer inputted data to an output buffer; the output buffer configured to buffer data outputted from the data output control unit, and output the buffered data to the data input/output pad; a test data input/output unit configured to latch test inputted data inputted and output test latch data or latch an output of the input buffer and output the test latch data; and a test loop control unit configured to transfer data or the test latch data to the data output control unit.

20 Claims, 2 Drawing Sheets

SEMICONDUCTOR APPARATUS

CROSS-REFERENCES TO RELATED APPLICATION

The present application claims priority under 35 U.S.C. §119(a) to Korean application number 10-2013-0091524, filed on Aug. 1, 2013, in the Korean Intellectual Property Office, which is incorporated herein by reference in its entirety.

BACKGROUND

1. Technical Field

Various embodiments relate to a semiconductor integrated circuit, and more particularly, to a semiconductor apparatus.

2. Related Art

A general semiconductor apparatus is configured to store inputted data and output stored data.

Semiconductor apparatuses have been developed to increase data storage capacity and speed of data input/output operations.

Semiconductor apparatuses typically have pads for inputting and outputting data from and to an external device (for example, a controller). In this regard, in order to increase the speed and amount of data input/output by the semiconductor apparatus a number of pads used in inputting and outputting the data may be increased.

However, as the number of pads increases for each semiconductor apparatus, the time required to test more than one semiconductor apparatus is lengthened. Test time is lengthened because the number of lines for electrically coupling test equipment with the semiconductor apparatuses is limited. Thus, the number of semiconductor apparatuses capable of being tested at the same time decreases.

SUMMARY

A semiconductor apparatus which can constantly maintain a test time regardless of the number of pads for input/output of data is described herein.

In an embodiment of the present invention, a semiconductor apparatus includes: an input buffer configured to be activated during a write operation, and buffer and output inputted data; a data input control unit configured to be activated in the write operation, and transfer data outputted from the input buffer; a data output control unit configured to be activated during a read operation, and transfer data, to an output buffer; the output buffer configured to be activated during the read operation, buffer data outputted from the data output control unit, and output the buffered data to the data input/output pad; a test data input/output unit configured to latch test data inputted from a test data input pad and output test latch data or latch an output of the input buffer and output the test latch data, in response to a test control signal and a test clock; and a test loop control unit configured to transfer data to the data output control unit or transfer the test latch data to the data output control unit, in response to the test control signal, wherein all of the input buffer, the data input control unit, the data output control unit and the output buffer are activated during a test.

In an embodiment of the present invention, a semiconductor apparatus includes: a first data input/output control block configured to transfer data inputted from a first data input/output pad, to a first data input/output line in response to a write command and transfer data inputted from the first data input/output line, to the first data input/output pad in response to a read command, during a normal operation, and latch test data inputted from a test data input pad and output first test latch data, during a test; and a second data input/output control block configured to transfer data inputted from a second data input/output pad, to a second data input/output line in response to the write command and transfer data inputted from the second data input/output line, to the second data input/output pad in response to the read command, in the normal operation, and latch the first test latch data and output second test latch data, in the test.

Accordingly, the semiconductor apparatus may constantly maintain a test time regardless of the number of pads for input/output of data, and thus, it is possible to test a large number of semiconductor apparatuses at the same time.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present disclosure will be described below with reference to the accompanying drawings through example embodiments.

Figure 1:
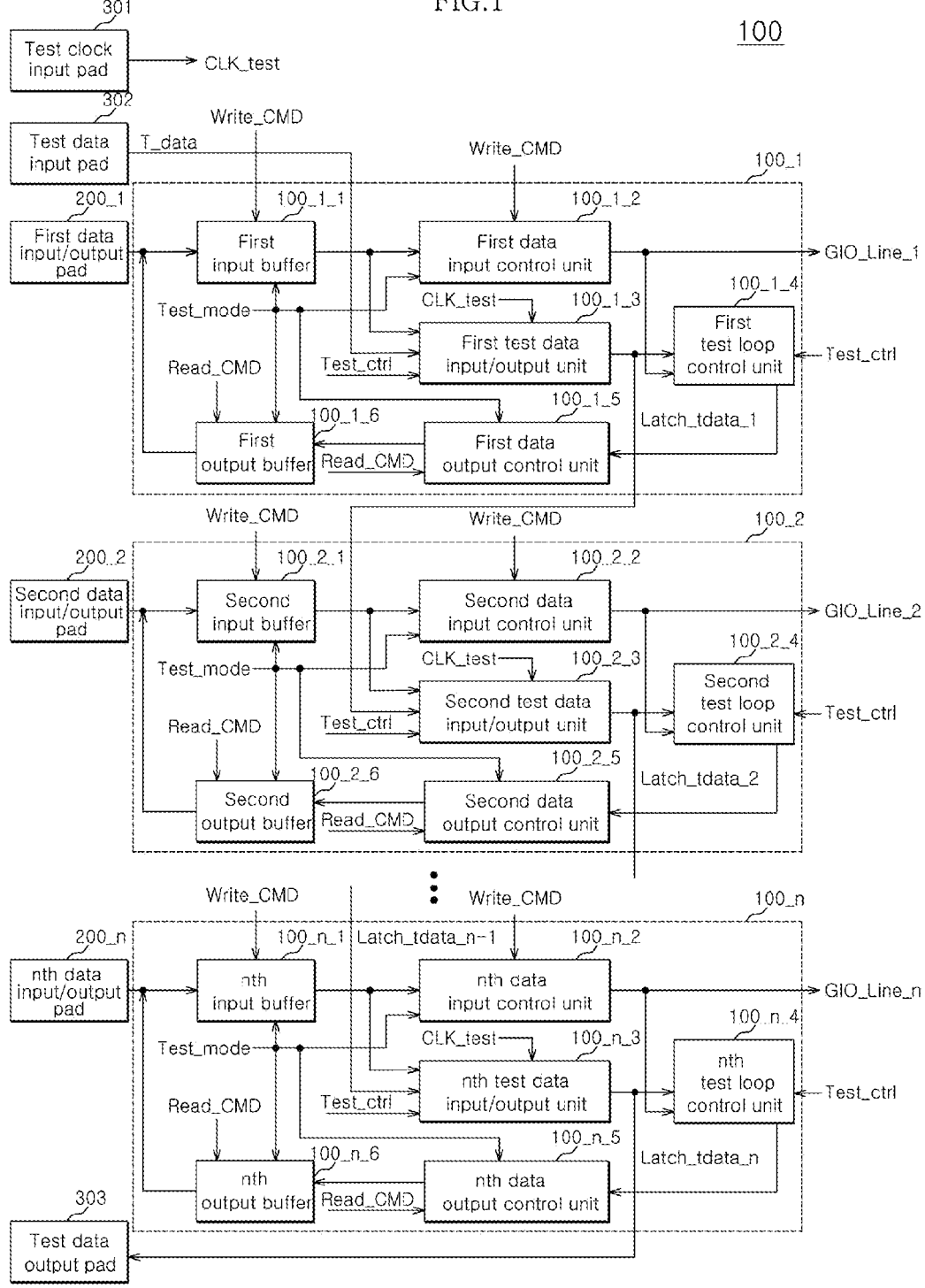
FIG. 1 is a configuration diagram of a semiconductor apparatus in accordance with an embodiment.

Referring to FIG. 1, a semiconductor apparatus 100 in accordance with an embodiment of the present disclosure includes first to $n^{th}$ data input/output control blocks 100_1, 100_2, . . . and 100_n, first to $n^{th}$ data input/output pads 200_1, 200_2, . . . and 200_n, a test clock input pad 301, a test data input pad 302, and a test data output pad 303.

During a normal operation, the first data input/output control block 100_1 is configured to transfer data inputted from the first data input/output pad 200_1 to a first data input/output line GIO_Line_1 in response to a write command Write_CMD, and the first data input/output control block 100_1 is configured to transfer data inputted from the first data input/output line GIO_Line_1 to the first data input/output pad 200_1 in response to a read command Read_CMD. Still further, first data input/output control block 100_1 may be configured to latch test data T_data inputted from the test data input pad 302 and output first test latch data Latch_t-data_1, during a test.

The first data input/output control block 100_1 includes a first input buffer 100_1_1, a first data input control unit 100_1_2, a first test data input/output unit 100_1_3, a first test loop control unit 100_1_4, a first data output control unit 100_1_5, and a first output buffer 100_1_6.

The first input buffer 100_1_1 is electrically coupled with the first data input/output pad 200_1. The first input buffer 100_1_1 is configured to be activated in response to the write command Write_CMD and buffer and output data inputted from the first data input/output pad 200_1. Also, the first input buffer 100_1_1 is configured to be activated in response to a test mode signal Test_mode and buffer and output an inputted signal. For instance, the first input buffer 100_1_1 is activated when the write command Write_CMD is inputted or the test mode signal Test_mode is enabled. The first input buffer 100_1_1 also buffers the signal inputted to the input terminal of the first input buffer 100_1_1 and transfers the buffered signal to the first data input control unit 100_1_2.

The first data input control unit 100_1_2 is configured to be activated in response to the write command Write_CMD and transfer the output of the first input buffer 100_1_1 to the first data input/output line GIO_Line_1. Also, the first data input control unit 100_1_2 is configured to be activated in response to the test mode signal Test_mode and transfer the output of the first input buffer 100_1_1 to the first data input/output line GIO_Line_1. For example, the first data input control unit 100_1_2 is activated when the write command Write_CMD is inputted or the test mode signal Test_mode is enabled, and the first data input control unit 100_1_2 transfers the output of the first input buffer 100_1_1 to the first data input/output line GIO_Line_1.

The first test data input/output unit 100_1_3 is configured to latch the test data T_data inputted from the test data input pad 302 or the output of the first input buffer 100_1_1 in response to a test control signal Test_ctrl and a test clock CLK_test. The first test data input/output unit 100_1_3 is also configured to output the latched test data T_data as the first test latch data Latch_tdata_1. For instance, when the test control signal Test_ctrl is enabled, the first test data input/output unit 100_1_3 latches the test data T_data when the test clock CLK_test transitions to a specified level (a high level), and outputs the latched test data T_data as the first test latch data Latch_tdata_1. When the test control signal Test_ctrl is disabled, the first test data input/output unit 100_1_3 latches the output of the first input buffer 100_1_1 when the test clock CLK_test transitions to the specified level (the high level), and the first test data input/output unit 100_1_3 outputs the latched output as the first test latch data Latch_tdata_1. The test clock CLK_test is a clock which is inputted from the test clock input pad 301.

Figure 2:
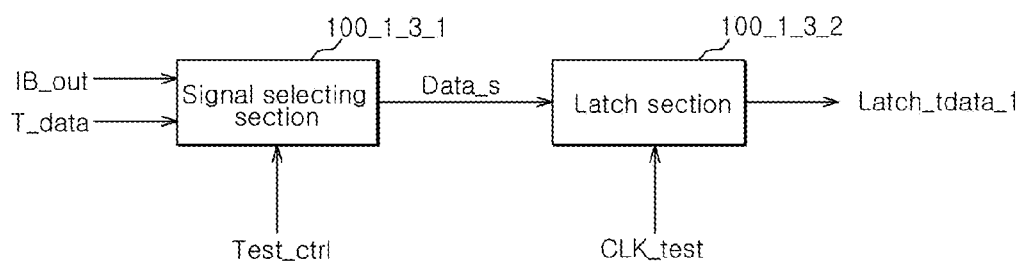
FIG. 2 is a configuration diagram of the first test data input/output control unit of FIG. 1.

Referring to FIG. 2, the first test data input/output unit 100_1_3 includes a signal selecting section 100_1_3_1 and a latch section 100_1_3_2.

The signal selecting section 100_1_3_1 is configured to output one of an output IB_out and the test data T_data as selected data Data_s in response to the test control signal Test_ctrl. The signal selecting section 100_1_3_1 may receive the output IB_out from the first input buffer 100_1_1. The signal selecting section 100_1_3_1 may include a multiplexer.

The latch section 100_1_3_2 is configured to latch the selected data Data_s when the test clock CLK_test transitions to the high level, and output the first test latch data Latch_tdata_1. The latch section 100_1_3_2 may include a flip-flop.

Returning now to FIG. 1, the first test loop control unit 100_1_4 is configured to output the data of the first data input/output line GIO_Line_1 or output the first test latch data Latch_tdata_1 to the first data output control unit 100_1_5 in response to the test control signal Test_ctrl. For instance, the first test loop control unit 100_1_4 transfers the data of the first data input/output line GIO_Line_1 to the first data output control unit 100_1_5 when the test control signal Test_ctrl is enabled. The first test loop control unit 100_1_4 transfers the first test latch data Latch_tdata_1 to the first data output control unit 100_1_5 when the test control signal Test_ctrl is disabled.

The first data output control unit 100_1_5 is configured to be activated in response to the read command Read_CMD and the test mode signal Test_mode. The first data output control unit 100_1_5 is also configured to transfer the output of the first test loop control unit 100_1_4 to the first output buffer 100_1_6. For instance, the first data output control unit 100_1_5 is activated when the read command Read_CMD is inputted or the test mode signal Test_mode is enabled. If the first data output control unit 100_1_5 is activated, the first data output control unit 100_1_5 transfers the output of the first test loop control unit 100_1_4 to the first output buffer 100_1_6.

The first output buffer 100_1_6 is configured to be activated in response to the read command Read_CMD and the test mode signal Test_mode. The first output buffer 100_1_6 is also configured to buffer the output of the first data output control unit 100_1_5 and transfer the buffered output to the first data input/output pad 200_1. The output terminal of the first output buffer 100_1_6, the input terminal of the first input buffer 100_1_1 and the first data input/output pad 200_1 are commonly electrically coupled.

During a normal operation, the second data input/output control block 100_2 is configured to transfer the data inputted from the second data input/output pad 200_2 to a second data input/output line GIO_Line_2 in response to the write command Write_CMD, and the second data input/output control block 100_2 may be configured to transfer data inputted from the second data input/output line GIO_Line_2 to the second data input/output pad 200_2 in response to the read command Read_CMD. Also, during a test, the second data input/output control block 100_2 is configured to latch the first test latch data Latch_tdata_1 of the first data input/output control block 100_1 and output second test latch data Latch_tdata_2.

The second data input/output control block 100_2 includes a second input buffer 100_2_1, a second data input control unit 100_2_2, a second test data input/output unit 100_2_3, a second test loop control unit 100_2_4, a second data output control unit 100_2_5, and a second output buffer 100_2_6.

The second input buffer 100_2_1 is electrically coupled with the second data input/output pad 200_2. The second input buffer 100_2_1 is configured to be activated in response to the write command Write_CMD and buffer and output the data inputted from the second data input/output pad 200_2. Also, the second input buffer 100_2_1 is configured to be activated in response to the test mode signal Test_mode and buffer and output an inputted signal. For instance, the second input buffer 100_2_1 is activated when the write command Write_CMD is inputted or the test mode signal Test_mode is enabled. The second input buffer 100_2_1 also buffers the signal inputted to the input terminal thereof and transfers the buffered signal to the second data input control unit 100_2_2.

The second data input control unit 100_2_2 is configured to be activated in response to the write command Write_CMD and transfer the output of the second input buffer 100_2_1 to the second data input/output line GIO_Line_2. Also, the second data input control unit 100_2_2 is configured to be activated in response to the test mode signal Test_mode and transfer the output of the second input buffer 100_2_1 to the second data input/output line GIO_Line_2. For example, the second data input control unit 100_2_2 is activated when the write command Write_CMD is inputted or the test mode signal Test_mode is enabled, and the second data input control unit 100_2_2 transfers the output of the second input buffer 100_2_1 to the second data input/output line GIO_Line_2.

The second test data input/output unit 100_2_3 is configured to latch the first test latch data Latch_tdata_1 or the output of the second input buffer 100_2_1 in response to the test control signal Test_ctrl and the test clock CLK_test. The first test latch data Latch_tdata_1 may be outputted from the first test data input/output unit 100_1_3. The second test data input/output unit 100_2_3 is also configured to output the latched data as the second test latch data Latch_tdata_2. For instance, when the test control signal Test_ctrl is enabled, the second test data input/output unit 100_2_3 latches the first test latch data Latch_tdata_1 when the test clock CLK_test transitions to the specified level (the high level), and the second test data input/output unit 100_2_3 outputs the latched data as the second test latch data Latch_tdata_2. When the test control signal Test_ctrl is disabled, the second test data input/output unit 100_2_3 latches the output of the second input buffer 100_2_1 when the test clock CLK_test transitions to the specified level (the high level), and the second test data input/output unit 100_2_3 outputs the latched output as the second test latch data Latch_tdata_2. The test clock CLK_test is the clock which is inputted from the test clock input pad 301.

The second test data input/output unit 100_2_3 is configured in a substantially similar manner as the first test data input/output unit 100_1_3 shown in FIG. 2, except that the signals inputted thereto and outputted therefrom are different.

The second test loop control unit 100_2_4 is configured to output the data of the second data input/output line GIO_Line_2 or the second test latch data Latch_tdata_2 to the second data output control unit 100_2_5 in response to the test control signal Test_ctrl. For instance, the second test loop control unit 100_2_4 transfers the data of the second data input/output line GIO_Line_2 to the second data output control unit 100_2_5 when the test control signal Test_ctrl is enabled, and the second test loop control unit 100_2_4 transfers the second test latch data Latch_tdata_2 to the second data output control unit 100_2_5 when the test control signal Test_ctrl is disabled.

The second data output control unit 100_2_5 is configured to be activated in response to the read command Read_CMD and the test mode signal Test_mode. The second data output control unit 100_2_5 is also configured to transfer the output of the second test loop control unit 100_2_4 to the second output buffer 100_2_6. For instance, the second data output control unit 100_2_5 is activated when the read command Read_CMD is inputted or the test mode signal Test_mode is enabled. If the second data output control unit 100_2_5 is activated, the second data output control unit 100_2_5 transfers the output of the second test loop control unit 100_2_4 to the second output buffer 100_2_6.

The second output buffer 100_2_6 is configured to be activated in response to the read command Read_CMD and the test mode signal Test_mode. The second output buffer 100_2_6 is also configured to buffer the output of the second data output control unit 100_2_5 and transfer the buffered output to the second data input/output pad 200_2. The output terminal of the second output buffer 100_2_6, the input terminal of the second input buffer 100_2_1 and the second data input/output pad 200_2 are commonly electrically coupled.

During a normal operation, the $n^{th}$ data input/output control block 100_n is configured to transfer the data inputted from the $n^{th}$ data input/output pad 200_n to an $n^{th}$ data input/output line GIO_Line_n in response to the write command Write_CMD, and transfer the data inputted from the $n^{th}$ data input/output line GIO_Line_n to the $n^{th}$ data input/output pad 200_n in response to the read command Read_CMD. Also, during a test, the $n^{th}$ data input/output control block 100_n is configured to latch n-$1^{th}$ test latch data Latch_tdata_n-1 of the n-$1^{th}$ data input/output control block 100_n-1 and output $n^{th}$ test latch data Latch_tdata_n.

The $n^{th}$ data input/output control block 100_n includes an $n^{th}$ input buffer 100_n_1, an $n^{th}$ data input control unit 100_n_2, an $n^{th}$ test data input/output unit 100_n_3, an $n^{th}$ test loop control unit 100_n_4, an $n^{th}$ data output control unit 100_n_5, and an $n^{th}$ output buffer 100_n_6.

The $n^{th}$ input buffer 100_n_1 is electrically coupled with the $n^{th}$ data input/output pad 200_n. The $n^{th}$ input buffer 100_n_1 is also configured to be activated in response to the write command Write_CMD and buffer and output the data inputted from the $n^{th}$ data input/output pad 200_n. Also, the $n^{th}$ input buffer 100_n_1 is configured to be activated in response to the test mode signal Test_mode, and buffer and output an inputted signal. For instance, the $n^{th}$ input buffer 100_n_1 is activated when the write command Write_CMD is inputted or the test mode signal Test_mode is enabled. The $n^{th}$ input buffer 100_n_1 buffers the signal inputted to the input terminal thereof and transfers the buffered signal to the $n^{th}$ data input control unit 100_n_2.

The $n^{th}$ data input control unit 100_n_2 is configured to be activated in response to the write command Write_CMD and transfer the output of the $n^{th}$ input buffer 100_n_1 to the $n^{th}$ data input/output line GIO_Line_n. Also, the $n^{th}$ data input control unit 100_n_2 is configured to be activated in response to the test mode signal Test_mode and transfer the output of the $n^{th}$ input buffer 100_n_1 to the $n^{th}$ data input/output line GIO_Line_n. For example, the $n^{th}$ data input control unit 100_n_2 is activated when the write command Write_CMD is inputted or the test mode signal Test_mode is enabled, and the $n^{th}$ data input control unit 100_n_2 transfers the output of the $n^{th}$ input buffer 100_n_1 to the $n^{th}$ data input/output line GIO_Line_n.

The $n^{th}$ test data input/output unit 100_n_3 is configured to latch the output of the n-$1^{th}$ test data input/output unit 100_n-1_3 (that is, the n-$1^{th}$ test latch data Latch_tdata_n-1) or the output of the $n^{th}$ input buffer 100_n_1 in response to the test control signal Test_ctrl and the test clock CLK_test. The $n^{th}$ test data input/output unit 100_n_3 is also configured to output the latched data as the $n^{th}$ test latch data Latch_tdata_n. For instance, when the test control signal Test_ctrl is enabled, the $n^{th}$ test data input/output unit 100_n_3 latches the n-$1^{th}$ test latch data Latch_tdata_n-1 when the test clock CLK_test transitions to the specified level (the high level), and $n^{th}$ test data input/output unit 100_n_3 outputs the latched data as the $n^{th}$ test latch data Latch_tdata_n. When the test control signal Test_ctrl is disabled, the $n^{th}$ test data input/output unit 100_n_3 latches the output of the $n^{th}$ input buffer 100_n_1 when the test clock CLK_test transitions to the specified level (the high level), and outputs the latched output as the $n^{th}$ test latch data Latch_tdata_n. The test clock CLK_test is the clock which is inputted from the test clock input pad 301.

The $n^{th}$ test data input/output unit 100_n_3 is configured in a substantially similar manner as the first test data input/output unit 100_1_3 shown in FIG. 2, except that the signals inputted thereto and outputted therefrom are different.

The $n^{th}$ test loop control unit 100_n_4 is configured to output the data of the $n^{th}$ data input/output line GIO_Line_n or the $n^{th}$ test latch data Latch_tdata_n to the $n^{th}$ data output control unit 100_n_5 in response to the test control signal Test_ctrl. For instance, the $n^{th}$ test loop control unit 100_n_4 transfers the data of the $n^{th}$ data input/output line GIO_Line_n to the $n^{th}$ data output control unit 100_n_5 when the test control signal Test_ctrl is enabled, and the $n^{th}$ test loop control unit 100_n_4 transfers the $n^{th}$ test latch data Latch_tdata_n to the $n^{th}$ data output control unit 100_n_5 when the test control signal Test_ctrl is disabled.

The $n^{th}$ data output control unit 100_n_5 is configured to be activated in response to the read command Read_CMD and the test mode signal Test_mode. The $n^{th}$ data output control unit 100_n_5 is also configured transfer the output of the $n^{th}$ test loop control unit 100_n_4 to the $n^{th}$ output buffer 100_n_6. For instance, the $n^{th}$ data output control unit 100_n_5 is activated when the read command Read_CMD is inputted or the test mode signal Test_mode is enabled. If the $n^{th}$ data output control unit 100_n_5 is activated, the $n^{th}$ data output control unit 100_n_5 transfers the output of the n<sup>th</sup> test loop control unit 100_n_4 to the n<sup>th</sup> output buffer 100_n_6.

The n<sup>th</sup> output buffer 100_n_6 is configured to be activated in response to the read command Read_CMD and the test mode signal Test_mode, buffer the output of the n<sup>th</sup> data output control unit 100_n_5. The n<sup>th</sup> output buffer 100_n_6 is also configured to transfer the buffered output to the n<sup>th</sup> data input/output pad 200_n. The output terminal of the n<sup>th</sup> output buffer 100_n_6, the input terminal of the n<sup>th</sup> input buffer 100_n_1 and the n<sup>th</sup> data input/output pad 200_n are commonly electrically coupled.

The first to n<sup>th</sup> data input control units 100_1_2, 100_2_2, ... and 100_n_2 may be configured to convert external data, that is, serial data, inputted from the first to n<sup>th</sup> data input/output pads 200_1, 200_2, ... and 200_n, into parallel data, and transfer the converted parallel data to the first to n<sup>th</sup> data input/output lines GIO_Line_1, GIO_Line_2, ... and GIO_Line_n. Further, the first to n<sup>th</sup> data output control units 100_1_5, 100_2_5, ... and 100_n_5 may be configured to convert data, that is, parallel data, inputted from the first to n<sup>th</sup> data input/output lines GIO_Line_1, GIO_Line_2, ... and GIO_Line_n, into serial data, and transfer the converted serial data to the first to n<sup>th</sup> data input/output pads 200_1, 200_2, ... and 200_n.

The semiconductor apparatus in accordance with embodiments of the present disclosure, configured as mentioned above, operates as follows.

In the normal operation, that is, not in the case of a test, the first to n<sup>th</sup> data input/output control blocks 100_1, 100_2, ... and 100_n output data inputted from the first to n<sup>th</sup> data input/output pads 200_1, 200_2, ... and 200_n, to the first to n<sup>th</sup> data input/output lines GIO_Line_1, GIO_Line_2, ... and GIO_Line_n in response to the write command Write_CMD. Also, in the normal operation, the first to n<sup>th</sup> data input/output control blocks 100_1, 100_2, ... and 100_n output the data of the first to n<sup>th</sup> data input/output lines GIO_Line_1, GIO_Line_2, ... and GIO_Line_n to the first to n<sup>th</sup> data input/output pads 200_1, 200_2, ... and 200_n in response to the read command Read_CMD.

In the test, that is, when the test mode signal Test_mode is enabled and the test control signal Test_ctrl is enabled, the first test data input/output unit 100_1_3 of the first data input/output control block 100_1 latches the test data T_data when the test clock CLK_test first transitions to the high level, and outputs the first test latch data Latch_tdata_1.

When the test mode signal Test_mode is enabled and the test control signal Test_ctrl is enabled, the second test data input/output unit 100_2_3 of the second data input/output control block 100_2 latches the first test latch data Latch_tdata_1 when the test clock CLK_test transitions to the high level, and the second data input/output control block 100_2 outputs the second test latch data Latch_tdata_2.

When the test mode signal Test_mode is enabled and the test control signal Test_ctrl is enabled, the n<sup>th</sup> test data input/output unit 100_n_3 of the n<sup>th</sup> data input/output control block 100_n latches the n-1<sup>th</sup> test latch data Latch_tdata_n-1 when the test clock CLK_test n<sup>th</sup> transitions to the high level, and outputs the n<sup>th</sup> test latch data Latch_tdata_n.

In one example, each time the test clock CLK_test transitions to the high level, the test data T_data with the values of (0, 1, ..., 0) are sequentially inputted from the test data input pad 302.

The first test data input/output unit 100_1_3 latches 0, the second test data input/output unit 100_2_3 latches 1, and the n<sup>th</sup> test data input/output unit 100_n_3 latches 0. If all the test data T_data are latched by the first to n<sup>th</sup> test data input/output units 100_1_3, 100_2_3, ... and 100_n_3, the test clock CLK_test is not inputted from the test clock input pad 301.

Thereafter, if the test control signal Test_ctrl is disabled and the test mode signal Test_mode is enabled, the first test loop control unit 100_1_4 of the first data input/output control block 100_1 transfers the first test latch data Latch_tdata_1 (latched by the first test data input/output unit 100_1_3) to the first data output control unit 100_1_5. The first data output control unit 100_1_5 outputs the first test latch data Latch_tdata_1 to the first output buffer 100_1_6. The first output buffer 100_1_6 outputs the first test latch data Latch_tdata_1 to the first data input/output pad 200_1. The first input buffer 100_1_1, which is activated by the test mode signal Test_mode, transfers the output of the first output buffer 100_1_6 to the first data input control unit 100_1_2 and the first test data input/output unit 100_1_3. The first data input control unit 100_1_2 transfers the output of the first input buffer 100_1_1 to the first data input/output line GIO_Line_1. At this time, the test control signal Test_ctrl is enabled. If the test control signal Test_ctrl is enabled, the first test loop control unit 100_1_4 transfers the data of the first data input/output line GIO_Line_1 to the first data output control unit 100_1_5.

As a result, the data latched by the first test data input/output unit 100_1_3 is transferred by being circulated through the first data output control unit 100_1_5, the first output buffer 100_1_6, the first input buffer 100_1_1, the first data input control unit 100_1_2, and the first test loop control unit 100_1_4.

If the test control signal Test_ctrl is disabled in the state and test mode signal Test_mode is enabled, the second test loop control unit 100_2_4 of the second data input/output control block 100_2 transfers the second test latch data Latch_tdata_2 (latched by the second test data input/output unit 100_2_3) to the second data output control unit 100_2_5. The second data output control unit 100_2_5 outputs the second test latch data Latch_tdata_2 to the second output buffer 100_2_6. The second output buffer 100_2_6 outputs the second test latch data Latch_tdata_2 to the second data input/output pad 200_2. The second input buffer 100_2_1, which is activated by the test mode signal Test_mode, transfers the output of the second output buffer 100_2_6 to the second data input control unit 100_2_2 and the second test data input/output unit 100_2_3. The second data input control unit 100_2_2 transfers the output of the second input buffer 100_2_1 to the second data input/output line GIO_Line_2. At this time, the test control signal Test_ctrl is enabled. If the test control signal Test_ctrl is enabled, the second test loop control unit 100_2_4 transfers the data of the second data input/output line GIO_Line_2 to the second data output control unit 100_2_5.

As a result, the data latched by the second test data input/output unit 100_2_3 is transferred by being circulated through the second data output control unit 100_2_5, the second output buffer 100_2_6, the second input buffer 100_2_1, the second data input control unit 100_2_2, and the second test loop control unit 100_24.

If the test control signal Test_ctrl is disabled and the test mode signal Test_mode is enabled, the n<sup>th</sup> test loop control unit 100_n_4 of the n<sup>th</sup> data input/output control block 100_n transfers the n<sup>th</sup> test latch data Latch_tdata_n latched by the n<sup>th</sup> test data input/output unit 100_n_3, to the n<sup>th</sup> data output control unit 100_n_5. The n<sup>th</sup> data output control unit 100_n_5 outputs the n<sup>th</sup> test latch data Latch_tdata_n to the n<sup>th</sup> output buffer 100_n_6. The n<sup>th</sup> output buffer 100_n_6 outputs the n<sup>th</sup> test latch data Latch_tdata_n to the n<sup>th</sup> data input/output pad 200_n. The n<sup>th</sup> input buffer 100_n_1, which is activated by the test mode signal Test_mode, transfers the output of the n$^{th}$ output buffer 100_n_6 to the n$^{th}$ data input control unit 100_n_2 and the n$^{th}$ test data input/output unit 100_n_3. The n$^{th}$ data input control unit 100_n_2 transfers the output of the n$^{th}$ input buffer 100_n_1 to the n$^{th}$ data input/output line GIO_Line_n. At this time, the test control signal Test_ctrl is enabled. If the test control signal Test_ctrl is enabled, the n$^{th}$ test loop control unit 100_n_4 transfers the data of the n$^{th}$ data input/output line GIO_Line_n to the n$^{th}$ data output control unit 100_n_5.

As a result, the data latched by the n$^{th}$ test data input/output unit 100_n_3 is transferred by being circulated through the n$^{th}$ data output control unit 100_n_5, the n$^{th}$ output buffer 100_n_6, the n$^{th}$ input buffer 100_n_1, the n$^{th}$ data input control unit 100_n_2, and the n$^{th}$ test loop control unit 100_n_4.

If the data latched by the first to n$^{th}$ test data input/output units 100_1_3, 100_2_3, ... and 100_n_3 are transferred by being circulated through the respective component elements of the first to n$^{th}$ data input/output control blocks 100_1, 100_2, ... and 100_n, after the test control signal Test_ctrl is enabled to activate the first to n$^{th}$ test data input/output units 100_1_3, 100_2_3, ... and 100_n_3, the test clock CLK_test is inputted.

The data is transferred by being circulated through the first to n$^{th}$ test data input/output units 100_1_3, 100_2_3, ... and 100_n_3 each time the test clock CLK_test transitions to the high level and the data is outputted through the test data output pad 303. The test data T_data, which is inputted to and stored in the first to n$^{th}$ test data input/output units 100_1_3, 100_2_3, ... and 100_n_3 through the test data input pad 302, is compared with the data outputted through the test data output pad 303. If the test data T_data and the data outputted through the test data output pad 303 are equal, all the first to n$^{th}$ data input/output control blocks 100_1, 100_2, ... and 100_n are operating normally. If the test data T_data and the data outputted through the test data output pad 303 are not equal, the first to n$^{th}$ data input/output control blocks 100_1, 100_2, ... and 100_n are abnormal, that is, there is in error in the operation of at least one of the first to n$^{th}$ data input/output control blocks 100_1, 100_2, ... and 100_n. Thus, an operating state of the first to n$^{th}$ data input/output control blocks 100_1, 100_2, ... and 100_n may be determined in accordance with whether or not the test data T_data and the data outputted through the test data output pad 303 are equal.

As a consequence, the semiconductor device in accordance with an embodiment of the present disclosure may test whether or not the respective component elements of the first to n$^{th}$ data input/output control blocks 100_1, 100_2, ... and 100_n operate normally operate, by using only the test clock input pad 301, the test data input pad 302 and the test data output pad 303. Therefore, even though the number of data input/output control blocks increases as the number of data input/output pads increases, when performing a test for determining whether or not the data input/output control blocks operate normally, the semiconductor apparatus in accordance with an embodiment may perform the test by using only a predetermined number of test pads.

Currently, while a semiconductor apparatus and a controller are used by being stacked, the semiconductor apparatus and the controller may be electrically coupled with each other using bumps. Since the size of each of the bumps is smaller than a generally used pad, the bumps are not electrically coupled with the lines of test equipment. In this case, a test may be performed by electrically coupling pads to the bumps. If the number of data input/output bumps is large, all the pads with a size larger than the bumps may not be electrically coupled to the bumps. In accordance with the disclosed embodiments, by electrically coupling a predetermined number of pads to the bumps, it is possible to test whether data input/output control blocks of the semiconductor apparatus operate normally.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
    an input buffer configured to be activated during a write operation, and buffer and output inputted data;
    a data input control unit configured to be activated in the write operation, and transfer data outputted from the input buffer;
    a data output control unit configured to be activated during a read operation, and transfer data inputted to an output buffer;
    the output buffer configured to be activated in the read operation, buffer data outputted from the data output control unit, and output the buffered data;
    a test data input/output unit configured to latch test data inputted from a test data input pad and output test latch data or latch an output of the input buffer and output the test latch data, in response to a test control signal and a test clock; and
    a test loop control unit configured to transfer data to the data output control unit or transfer the test latch data to the data output control unit, in response to the test control signal,
    wherein all of the input buffer, the data input control unit, the data output control unit and the output buffer are activated during a test.

2. The semiconductor apparatus according to claim 1,
    wherein the input buffer and the data input control unit are activated when a write command is inputted or a test mode signal is enabled, and
    wherein the output buffer and the data output control unit are activated when a read command is inputted or the test mode signal is enabled.

3. The semiconductor apparatus according to claim 1, wherein the test data input/output unit latches the test data and outputs the test latch data when the test clock transitions to a specified level if the test control signal is enabled, and latches the output of the input buffer and outputs the test latch data when the test clock transitions to the specified level if the test control signal is disabled.

4. The semiconductor apparatus according to claim 3, wherein the test data input/output unit comprises:
    a signal selecting section configured to output one of the test data and the output of the input buffer as selected data in response to the test control signal; and
    a latch section configured to latch the selected data in response to the test clock, and output the latched data as the test latch data.

5. The semiconductor apparatus according to claim 3, wherein the test loop control unit transfers the data of the data input/output line to the data output control unit when the test control signal is enabled, and transfers the test latch data to the data output control unit when the test control signal is disabled.

6. A semiconductor apparatus comprising:
- a first data input/output control block configured to transfer data inputted from a first data input/output pad, to a first data input/output line in response to a write command and transfer data inputted from the first data input/output line, to the first data input/output pad in response to a read command, during a normal operation, and latch test data inputted from a test data input pad and output a first test latch data, during a test; and
- a second data input/output control block configured to transfer data inputted from a second data input/output pad, to a second data input/output line in response to the write command and transfer data inputted from the second data input/output line, to the second data input/output pad in response to the read command, in the normal operation, and latch the first test latch data and output a second test latch data, in the test.

7. The semiconductor apparatus according to claim 6, wherein the first data input/output control block comprises:
- a first input buffer electrically coupled with the first data input/output pad;
- a first output buffer electrically coupled with the first data input/output pad;
- a first data input control unit configured to transfer an output of the first input buffer to the first data input/output line;
- a first test data input/output unit configured to latch data inputted from the test data input pad and output the first test latch data;
- a first test loop control unit configured to transfer an output of the first data input/output line or the first test data input/output unit to a first data output control unit; and
- the first data output control unit configured to transfer an output of the first test loop control unit to the first output buffer.

8. The semiconductor apparatus according to claim 7,
wherein the first input buffer is activated when the write command is inputted or a test mode signal is enabled, and transfers a signal inputted from an input terminal, to the first data input control unit, and
wherein the first output buffer is activated when the read command is inputted or the test mode signal is enabled, and transfers an output of the first data output control unit to an output terminal.

9. The semiconductor apparatus according to claim 8,
wherein the first data input control unit is activated when the write command is inputted or the test mode signal is enabled, and transfers the output of the first input buffer to the first data input/output line, and
wherein the first data output control unit is activated when the read command is inputted or the test mode signal is enabled, and transfers the output of the first test loop control unit to the first output buffer.

10. The semiconductor apparatus according to claim 9, wherein the first test data input/output unit latches the data inputted from the test data input pad and outputs the first test latch data when a test control signal is enabled, and outputs the output of the first input buffer as the first test latch data when the test control signal is disabled.

11. The semiconductor apparatus according to claim 10, wherein the first test loop control unit transfers data of the first data input/output line to the first data output control unit when the test control signal is enabled, and transfers the first test latch data to the first data output control unit when the test control signal is disabled.

12. The semiconductor apparatus according to claim 11, wherein the second data input/output control block comprises:
- a second input buffer electrically coupled with the second data input/output pad through an input terminal thereof;
- a second output buffer electrically coupled with the second data input/output pad through an output terminal thereof;
- a second data input control unit configured to transfer an output of the second input buffer to the second data input/output line;
- a second test data input/output unit configured to latch the first test latch data inputted from the first test data input/output unit and output the second test latch data;
- a second test loop control unit configured to transfer an output of the second data input/output line or the second test data input/output unit to a second data output control unit; and
- the second data output control unit configured to transfer an output of the second test loop control unit to the second output buffer.

13. The semiconductor apparatus according to claim 12, wherein the semiconductor apparatus is configured to test the first data input/output control block and the second data input/output control block using a test clock input pad, the test data input pad, a test data output pad.

14. The semiconductor apparatus according to claim 13, wherein the semiconductor apparatus is configured to determine an operating state of the first data input/output control block and the second input/output control block in accordance with a comparison of data outputted through the test data output pad and data inputted to the first test data input/output unit and the second test data input/output unit.

15. The semiconductor apparatus according to claim 14 wherein the operating state indicates an error in at least one of the first data input/output control block and the second data input/output control block if the data outputted through the test data output pad and data inputted to the first test data input/output unit and the second test data input/output unit are not equal.

16. The semiconductor apparatus according to claim 12,
wherein the second input buffer is activated when the write command is inputted or the test mode signal is enabled, and transfers a signal inputted from the input terminal, to the second data input control unit, and
wherein the second output buffer is activated when the read command is inputted or the test mode signal is enabled, and transfers an output of the second data output control unit to the output terminal.

17. The semiconductor apparatus according to claim 16,
wherein the second data input control unit is activated when the write command is inputted or the test mode signal is enabled, and transfers the output of the second input buffer to the second data input/output line, and
wherein the second data output control unit is activated when the read command is inputted or the test mode signal is enabled, and transfers the output of the second test loop control unit to the second output buffer.

18. The semiconductor apparatus according to claim 17, wherein the second test data input/output unit latches the first test latch data inputted from the first test data input/output unit and outputs the second test latch data when the test control signal is enabled, and outputs the output of the second input buffer as the second test latch data when the test control signal is disabled.

19. The semiconductor apparatus according to claim 18, wherein the second test loop control unit transfers data of the second data input/output line to the second data output control unit when the test control signal is enabled, and transfers the second test latch data to the second data output control unit when the test control signal is disabled.

20. The semiconductor apparatus according to claim 19, further comprising:
   a test data output pad configured to transfer the second test latch data outside the semiconductor apparatus.

* * * * *